(12) United States Patent
Kozuma et al.

(10) Patent No.: US 12,040,007 B2
(45) Date of Patent: Jul. 16, 2024

(54) SEMICONDUCTOR DEVICE AND ELECTRONIC DEVICE

(71) Applicant: Semiconductor Energy Laboratory Co., Ltd., Atsugi (JP)

(72) Inventors: Munehiro Kozuma, Atsugi (JP); Takayuki Ikeda, Atsugi (JP); Kei Takahashi, Isehara (JP); Takeshi Aoki, Ebina (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 362 days.

(21) Appl. No.: 17/604,523

(22) PCT Filed: Apr. 13, 2020

(86) PCT No.: PCT/IB2020/053464
§ 371 (c)(1),
(2) Date: Oct. 18, 2021

(87) PCT Pub. No.: WO2020/217130
PCT Pub. Date: Oct. 29, 2020

(65) Prior Publication Data
US 2022/0208245 A1 Jun. 30, 2022

(30) Foreign Application Priority Data
Apr. 26, 2019 (JP) .................. 2019-084943

(51) Int. Cl.
*G11C 11/4074* (2006.01)
*G06F 3/06* (2006.01)
(Continued)

(52) U.S. Cl.
CPC ........ *G11C 11/4074* (2013.01); *G06F 3/0604* (2013.01); *G06F 3/0655* (2013.01);
(Continued)

(58) Field of Classification Search
CPC .............. G11C 11/4074; G11C 11/405; G11C 11/4096; G11C 7/14; G11C 7/16;
(Continued)

(56) References Cited

U.S. PATENT DOCUMENTS 5,430,859 A 7/1995 Norman et al.
5,615,162 A 3/1997 Houston
(Continued)

FOREIGN PATENT DOCUMENTS

JP 2000-151317 A 5/2000
JP 2015-023561 A 2/2015
(Continued)

OTHER PUBLICATIONS

International Search Report (Application No. PCT/IB2020/053464) dated Jul. 28, 2020.
(Continued)

*Primary Examiner* — Mohammad M Choudhry
(74) *Attorney, Agent, or Firm* — Eric J. Robinson; Robinson Intellectual Property Law Office, P.C.

(57) ABSTRACT

A semiconductor device with reduced power consumption is provided. The semiconductor device includes a transmitter unit, a receiver unit, a bias-outputting unit, and a controller unit. The bias-outputting unit has a plurality of memory units. The plurality of memory units each retains information to determine transmission power. The receiver unit receives a request signal transmitted from a base station and supplies it to the controller unit. The controller unit selects one of the plurality of memory units according to the request signal. The memory unit has an OS transistor and retains information when power supply is stopped.

5 Claims, 16 Drawing Sheets

(51) Int. Cl.
| | |
|---|---|
| G11C 11/405 | (2006.01) |
| G11C 11/4096 | (2006.01) |
| H01L 27/12 | (2006.01) |
| H01L 29/786 | (2006.01) |
| H10B 12/00 | (2023.01) |

(52) U.S. Cl.
CPC .......... *G06F 3/0679* (2013.01); *G11C 11/405* (2013.01); *G11C 11/4096* (2013.01); *H01L 27/1225* (2013.01); *H01L 27/124* (2013.01); *H01L 27/1255* (2013.01); *H01L 29/78648* (2013.01); *H01L 29/7869* (2013.01); *H10B 12/00* (2023.02)

(58) Field of Classification Search
CPC .... G06F 3/0604; G06F 3/0655; G06F 3/0679; H01L 27/1225; H01L 27/124; H01L 27/1255; H01L 29/78648; H01L 29/7869; H01L 29/78696; H01L 21/8234; H01L 27/06; H01L 27/088; H10B 12/00
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,408,193 | B1 | 6/2002 | Katagishi et al. |
| 6,563,174 | B2 | 5/2003 | Kawasaki et al. |
| 6,727,522 | B1 | 4/2004 | Kawasaki et al. |
| 6,917,823 | B2 | 7/2005 | Katagishi et al. |
| 6,973,334 | B2 | 12/2005 | Katagishi et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,614,916 | B2 | 12/2013 | Nagatsuka et al. |
| 9,065,438 | B2 | 6/2015 | Aoki et al. |
| 9,172,370 | B2 | 10/2015 | Ikeda et al. |
| 9,202,546 | B2 | 12/2015 | Yamazaki et al. |
| 9,374,048 | B2 | 6/2016 | Koyama et al. |
| 9,837,963 | B2 | 12/2017 | Koyama et al. |
| 10,090,031 | B2 | 10/2018 | Ishizu et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0132587 | A1 | 9/2002 | Katagishi et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0030283 | A1 | 2/2006 | Katagishi et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0024318 | A1 | 2/2007 | Mamidipaka |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1* | 3/2009 | Kuwabara ............ H01L 27/124 257/E27.06 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089417 | A1 | 4/2011 | Yamazaki et al. |
| 2011/0101351 | A1 | 5/2011 | Yamazaki |
| 2015/0054550 | A1 | 2/2015 | Koyama et al. |
| 2015/0061742 | A1 | 3/2015 | Maehashi. et al. |
| 2015/0091629 | A1 | 4/2015 | Ishizu et al. |
| 2016/0006433 | A1 | 1/2016 | Ishizu et al. |
| 2016/0232956 | A1 | 8/2016 | Ishizu et al. |
| 2016/0233866 | A1 | 8/2016 | Ishizu et al. |

FOREIGN PATENT DOCUMENTS

| | | |
|---|---|---|
| JP | 2015-062278 A | 4/2015 |
| JP | 2016-149175 A | 8/2016 |
| KR | 2000-0035217 A | 6/2000 |

(56) References Cited

FOREIGN PATENT DOCUMENTS

| KR | 2016-0098076 A | 8/2016 |
|---|---|---|
| WO | WO-2018/220471 | 12/2018 |

OTHER PUBLICATIONS

Written Opinion (Application No. PCT/IB2020/053464) dated Jul. 28, 2020.

* cited by examiner

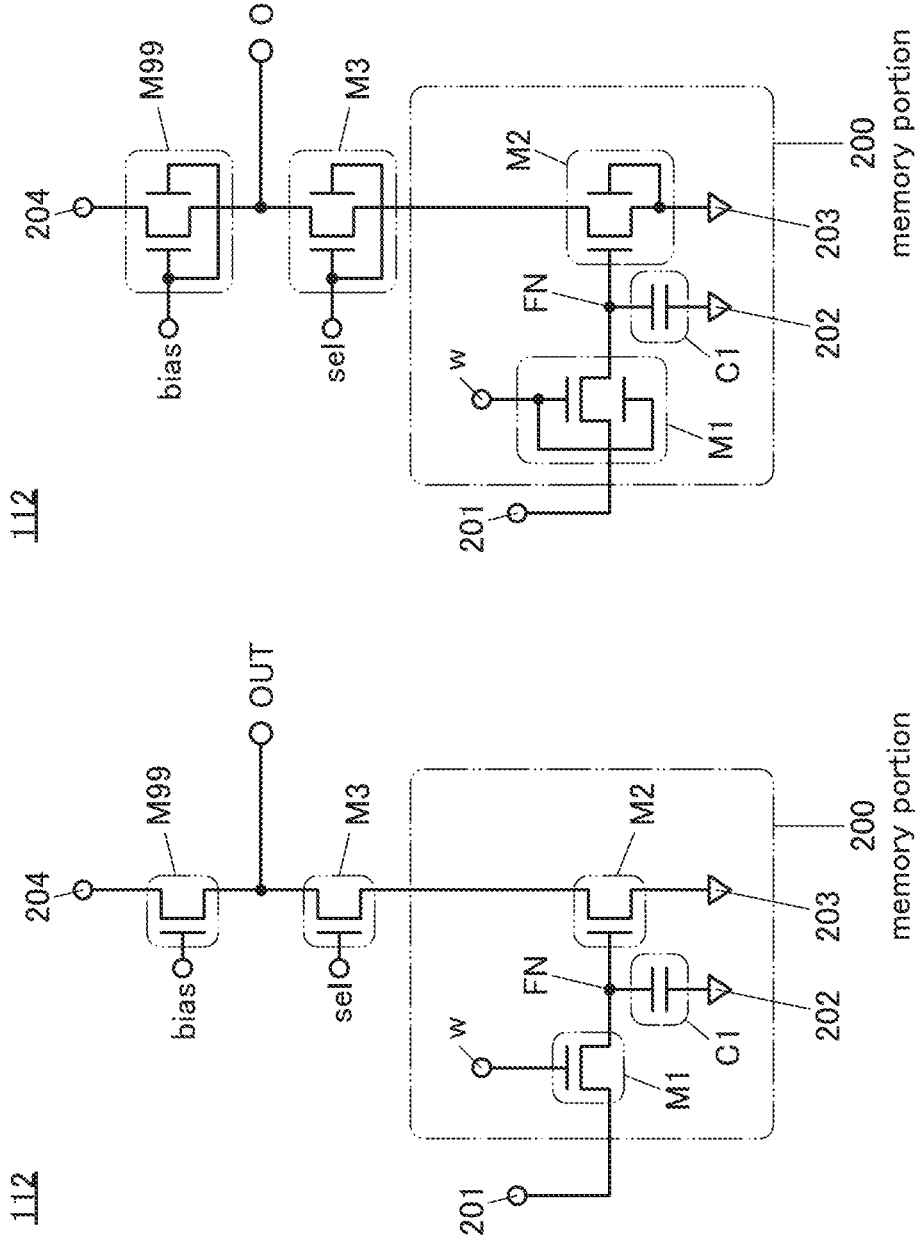
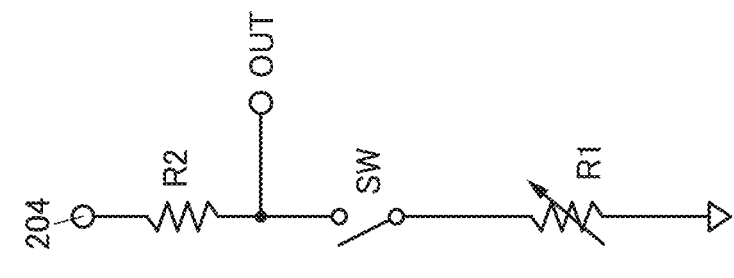
FIG. 2A
FIG. 2B
FIG. 2C

FIG. 15A
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
Intermediate state
New crystalline phase
FIG. 15B
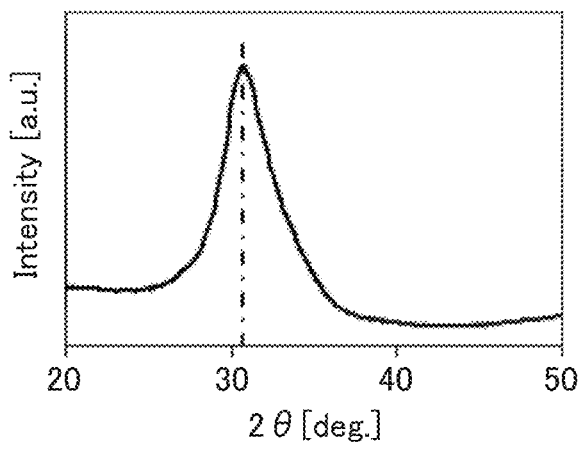
FIG. 15C
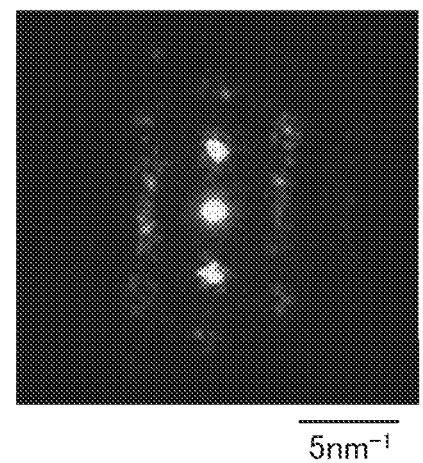

SEMICONDUCTOR DEVICE AND ELECTRONIC DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

In recent days, portable information terminals that are easy to carry, typified by smartphones, tablet terminals, and the like, have come into widespread use. With the development of information technology such as Internet of Things (IoT), the amount of data processed by portable information terminals tends to increase. In addition, the communication speed of electronic devices such as portable information terminals needs to be improved. However, improvement of communication speed tends to increase power consumption; it is required to reduce power consumption of electronic devices such as portable information terminals.

Patent Document 1 and Patent Document 2 disclose technical ideas to reduce power consumption of a cellar phone.

REFERENCE

Patent Document

[Patent Document 1] Japanese Published Patent Application No. 2000-151317
[Patent Document 2] U.S. Pat. No. 6,408,193

SUMMARY OF THE INVENTION

Problems to be Solved by the Invention

An object of one embodiment of the present invention is to provide a semiconductor device with reduced power consumption, or the like. Another object is to provide a semiconductor device with high reliability, or the like. Another object is to provide a semiconductor device with high productivity, or the like. Another object is to provide a novel semiconductor device or the like.

Note that the description of these objects does not preclude the existence of other objects. In one embodiment of the present invention, there is no need to achieve all the objects. Other objects are apparent from and can be derived from the description of the specification, the drawings, the claims, and the like.

Means for Solving the Problems

A semiconductor device includes a transmitter unit, a receiver unit, a bias-outputting unit, and a controller unit. The bias-outputting unit includes a plurality of memory units. The plurality of memory units each includes information to decide a transmission power. The receiver unit receives a request signal transmitted from a base station and supplies it to the controller unit. The controller unit selects one of the plurality of memory units according to the request signal. The memory unit has an OS transistor and retains information when power supply is stopped.

One embodiment of the present invention is a semiconductor device including a transmitter unit, a receiver unit, a bias-outputting unit, and a controller unit. The transmitter unit has a function of changing an output power. The receiver unit has a function of supplying a first signal included in a received signal to the controller unit. The bias-outputting unit includes a plurality of memory units. The controller unit has a function of selecting a first memory unit out of the plurality of memory units according to the first signal. The bias-outputting unit has a function of outputting a second signal according to first data retained in the first memory unit. The transmitter unit has a function of determining the output power according to the second signal. The memory unit includes a first transistor and a capacitor. A semiconductor layer of the first transistor includes an oxide semiconductor.

The semiconductor layer preferably includes one or both of In and Zn. The memory unit has a function of retaining the first data when power supply is stopped. The controller unit may have a function of writing data to each of the plurality of memory units.

Effect of the Invention

According to one embodiment of the present invention, a semiconductor device with reduced power consumption, or the like can be provided. A semiconductor device or the like which stably operates can be provided. A semiconductor device or the like with high reliability can be provided. A semiconductor device with high productivity, or the like can be provided. Alternatively, a novel semiconductor device or the like can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 2A and FIG. 2B are diagrams showing circuit structure examples of bias-outputting units.
FIG. 2C is a diagram showing an equivalent circuit of the bias-outputting unit.

FIG. 15A is a table showing classifications of crystal structures of IGZO. FIG. 15B is a graph showing an XRD spectrum of a CAAC-IGZO film. FIG. 15C is an image showing nanobeam electron diffraction patterns of a CAAC-IGZO film.

MODE FOR CARRYING OUT THE INVENTION

Figure 1:
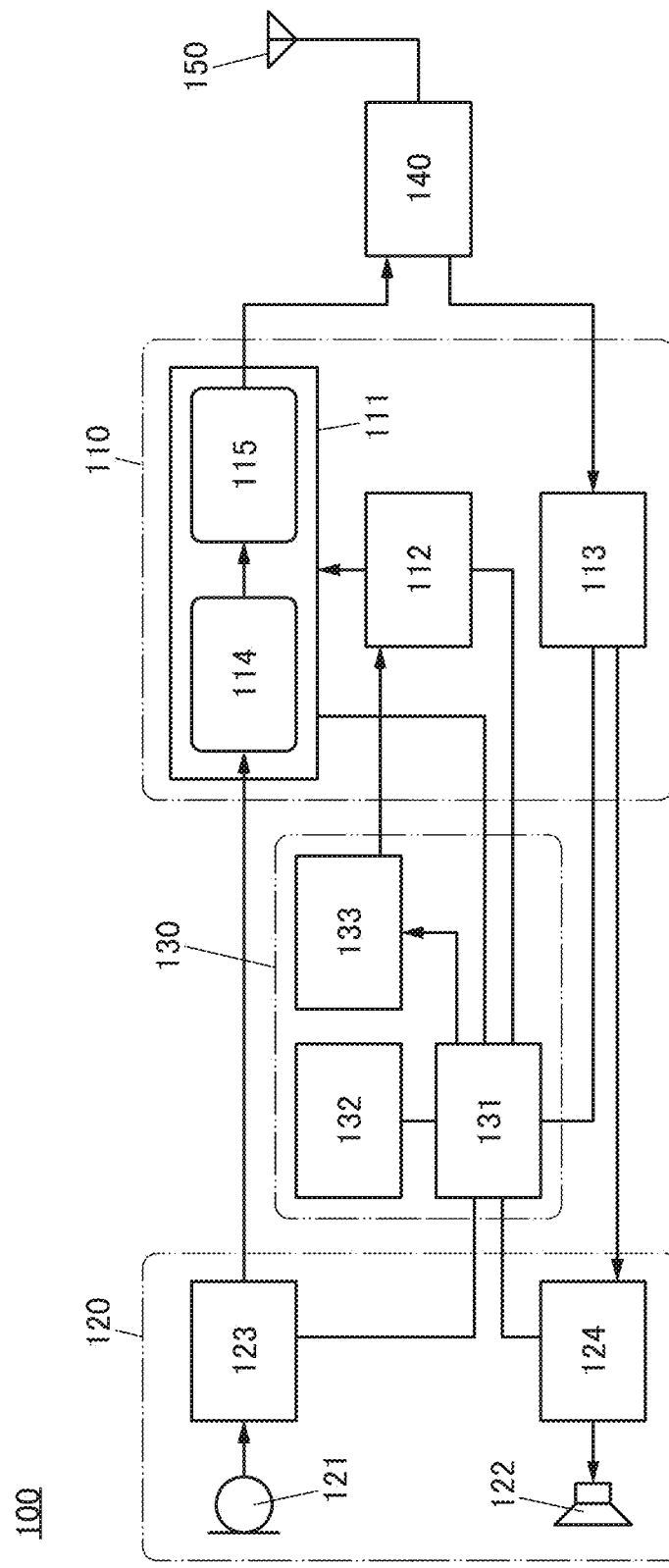
FIG. 1 is a diagram showing a structure example of a semiconductor device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in an actual manufacturing process, a resist mask or the like might be unintentionally reduced in size by treatment such as etching, which is not reflected in some cases for easy understanding.

Furthermore, in a top view (also referred to as a plan view), a perspective view, or the like, the description of some components might be omitted for easy understanding of the drawings.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that even a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). The potential VSS refers to a power supply potential at a potential lower than the potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or all of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

Embodiment 1

A semiconductor device of one embodiment of the present invention is described with reference to drawings. FIG. 1 is a block diagram showing a configuration example of a semiconductor device 100 of one embodiment of the present invention.

<Structure Example of Semiconductor Device>

A semiconductor device 100 includes a transmitter-receiver unit 110, a converter unit 120, a controller unit 130, a duplexer 140, and an antenna 150.

The transmitter-receiver unit 110 includes a transmitter unit 111, a bias-outputting unit 112, and a receiver unit 113. The transmitter unit 111 includes a variable amplifier unit 114 and a power amplifier unit 115.

The converter unit 120 includes a microphone 121, a speaker 122, a modulator 123, and a demodulator 124.

The controller unit 130 includes an arithmetic unit 131, a memory unit 132, and a DAC 133 (Digital Analog Converter). The arithmetic unit 131 has a function of controlling the transmitter unit 111, the bias-outputting unit 112, the receiver unit 113, the modulator 123, the demodulator 124, the memory unit 132, and the DAC 133. The arithmetic unit 131 has a function of performing calculations on operations of the entire semiconductor device 100.

A central processing unit (CPU) or the like can be used as the arithmetic unit 131, for example. Furthermore, the arithmetic unit 131 may be formed with a PLD (Programmable Logic Device) such as an FPGA (Field Programmable Gate Array) or an FPAA (Field Programmable Analog Array).

The memory unit 132 can store an operating system, an application program, a program module, program data, and the like. As the memory unit 132, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Alternatively, a memory media drive such as a hard disc drive (HDD) or a solid state drive (SSD) may be used, for example.

For example, the memory unit 132 can have a structure where a volatile memory such as a RAM (Random Access Memory) or a nonvolatile memory such as a ROM (Read Only Memory) is provided.

The microphone 121 has a function of converting an audio signal into an electric signal. The modulator 123 has a function of synthesizing the electric signal with a carrier wave to generate a transmission signal. The variable amplifier unit 114 has a function of changing gain to convert the voltage amplitude of the transmission signal into an amplitude suitable for transmission. The power amplifier unit 115 has a function of changing the power (also referred to as "transmission power") of the transmission signal output from the transmitter unit 111. For example, the power amplifier unit 115 can change a current value with a voltage amplitude of a transmission power not changed.

The power amplifier unit 115 determines a current-amplifying factor (bias) according to a bias signal supplied from the bias-outputting unit 112. The bias-outputting unit 112 has a function of determining the power output from the transmitter unit 111. The gain of the variable amplifier unit 114 may be controlled by the bias-outputting unit 112. The magnitude of the transmission power can be expressed by the product of voltage and current. The magnitude of the transmission power can be determined by one or both of gain and current-amplifying factor.

The transmission signal, whose transmission power is determined at the transmitter unit 111, is emitted to the space through the duplexer 140 and the antenna 150. The duplexer 140 has a function of transmitting and receiving a radio signal with one antenna 150.

Between the duplexer 140 and the power amplifier unit 115, a filter to remove an unnecessary frequency component (noise) may be provided.

The arithmetic unit 131 has a function of supplying n (n is an integer greater than or equal to 1) bias-setting voltage(s) and n bias-selecting signal(s) to the bias-outputting unit 112. The n bias-setting voltage(s) is determined by the setting data stored in the memory unit 132. The n bias-setting voltage(s) is supplied to the bias-outputting unit 112 through the DAC 133. The DAC 133 has a function of converting a digital signal to an analog signal.

The bias-outputting unit 112 has a function of storing n bias-setting voltage(s). The bias-outputting unit 112 has a function of outputting a bias signal selected by the bias-selecting signal(s).

The semiconductor device 100 of one embodiment of the present invention can receive a signal transmitted from another semiconductor device, a base station, or the like. A signal which is received (also referred to as "received signal") is input to the receiver unit 113 through the antenna 150 and the duplexer 140.

Between the duplexer 140 and the receiver unit 113, a filter to remove an unnecessary frequency component (noise) can be provided.

The receiver unit 113 has a function of supplying the received signal or part of a signal included in the received signal to the controller unit 130 as a request signal and the received signal or another part of a signal included in the received signal to the converter unit 120. For example, out of the received signal, the request signal is supplied to the arithmetic unit 131 and the other signals are supplied to the modulator 124. The request signal includes a value of transmission power requested by a base station.

The demodulator 124 has a function of converting the supplied received signal into an audio electric signal. The speaker 122 has a function of converting the electric signal into an audio signal.

[Structure Example of Bias-Outputting Unit 112]

Next, a structure example of the bias-outputting unit 112 is described. FIG. 2A shows a circuit structure example of the bias-outputting unit 112. The bias-outputting unit 112 in FIG. 2A includes a memory portion 200, a transistor M3, and a transistor M99. The memory portion 200 includes a transistor M1, a transistor M2, and a capacitor C1.

One of a source and a drain of the transistor M1 is electrically connected to a terminal 201, and the other is electrically connected to one electrode of the capacitor C1. The other electrode of the capacitor C1 is electrically connected to a terminal 202. A gate of the transistor M1 is electrically connected to a terminal w. One of a source and a drain of the transistor M2 is electrically connected to a terminal 203, and the other is electrically connected to one of a source and a drain of the transistor M3. A gate of the transistor M2 is electrically connected to the other of the source and the drain of the transistor M1.

A node where the other of the source and the drain of the transistor M1, the one electrode of the capacitor C1, and the gate of the transistor M2 are electrically connected to each other functions as a node FN. The one of the source and the drain of the transistor M3 is electrically connected to the other of the source and the drain of the transistor M2, and the other of the source and the drain of the transistor M3 is electrically connected to one of a source and a drain of the transistor M99. A gate of the transistor M3 is electrically connected to the terminal sel. The one of the source and the drain of the transistor M99 is electrically connected to a terminal OUT, and the other of the source and the drain is electrically connected to a terminal 204. A gate of the transistor M99 is electrically connected to a terminal bias.

The terminal 202 and the terminal 203 are supplied with VSS. The terminal 204 is supplied with VDD. A terminal 201 is electrically connected to the DAC 133, and a terminal w, a terminal sel, and a terminal bias are electrically connected to the arithmetic unit 131.

The transistor M1 to the transistor M3 and the transistor M99 may be transistors with back gates.

The back gate is placed so that a channel formation region of a semiconductor layer is sandwiched between the gate and the back gate. The back gate can function in a manner similar to that of the gate. By changing the potential of the back gate, the threshold voltage of the transistor can be changed. The potential of the back gate may be the same as the potential of the gate or may be a ground potential (GND potential) or a given potential.

In addition, the gate and the back gate are formed using conductive layers and thus each have a function of preventing an electric field generated outside the transistor from influencing the semiconductor layer in which a channel is formed (particularly, a function of preventing static electricity). That is, variation in the electrical characteristics of the transistor due to the influence of an external electric field such as static electricity can be prevented.

FIG. 2B shows a circuit structure example of the bias-outputting unit 112 in which transistors having back gates are used as the transistor M1 to the transistor M3 and the transistor M99.

In FIG. 2B, the gate and the back gate in each of the transistor M1, the transistor M3, and the transistor M99 are electrically connected to each other. FIG. 2B shows an example in which a back gate of the transistor M3 is electrically connected to one of the source and the drain thereof. The back gate of the transistor M3 may be electrically connected to the gate, not one of the source and the drain thereof.

As each of the transistor M1 to the transistor M3 and the transistor M99, a transistor including an oxide semiconductor, which is a kind of a metal oxide, in a semiconductor layer where a channel is formed (also referred to as an "OS transistor") is preferably used. An oxide semiconductor has a band gap of 2 eV or more and thus has an extremely low off-state current. Thus, the power consumption of the bias-outputting unit 112 can be reduced. The power consumption of a semiconductor device including the bias-outputting unit 112 can be reduced. In particular, when an OS transistor is used as the transistor M1, the potential of the node FN can be retained for a long time, which is preferable.

For example, the memory portion 200 which can retain data written to the node FN for a year or more, or ten years or more after power supply is stopped can be provided. The memory portion 200 can be regarded as a nonvolatile memory.

The off-state current of the OS transistor hardly increases even in a high temperature environment. Specifically, the off-state current hardly increases even at an environment temperature higher than or equal to room temperature and lower than or equal to 200° C. An OS transistor has high withstand voltage between its source and drain. When OS transistors are used as transistors included in a semiconductor device, the semiconductor device achieves stable operation and high reliability even in a high-temperature environment.

FIG. 2C is an equivalent circuit diagram of the bias-outputting unit 112 in FIG. 2A and FIG. 2B. The transistor M3 corresponds to a switch SW, and the transistor M99 corresponds to a resistor R2. The memory portion 200 corresponds to a resistor R1. Specifically, the transistor M2 included in the memory portion 200 corresponds to the resistor R1. The resistor R1 functions as a variable resistor.

When the switch SW becomes in the on state (conducting state), a voltage according to the ratio of the sum of the resistance value of the switch SW and the resistance value of the resistor R1 to the resistance value of the resistor R2 is generated at a terminal OUT. The resistance value of the switch SW and the resistance value of the resistor R2 can be seen as constant; the voltage generated at the terminal OUT changes according to the change of the resistance value of the resistor R1.

The resistance value of the resistor R1 corresponds to the resistance value between the source and the drain of the transistor M2. The resistance value is determined by the voltage of the node FN. The resistance value can be changed by changing the voltage of the node FN. In other words, by adjusting the voltage of the node FN, the voltage generated at the terminal OUT can be determined.

When the transistor functions as a switch, one of the source and the drain of the transistor corresponds to one end of the switch (one terminal), and the other of the source and the drain of the transistor corresponds to the other end (the other terminal) of the switch.

Figure 7A:
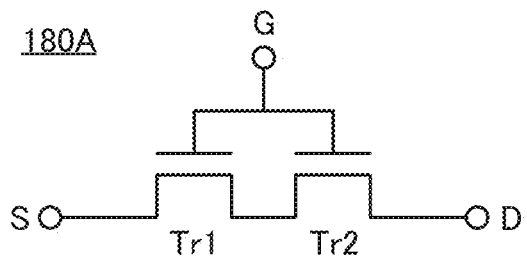
FIG. 7A to FIG. 7D are diagrams showing circuit symbols of transistors.

The transistor M1 to the transistor M3 and the transistor M99 may each be a double-gate transistor. FIG. 7A shows a circuit symbol example of a double-gate transistor 180A.

The transistor 180A has a structure in which a transistor Tr1 and a transistor Tr2 are connected in series. FIG. 7A shows a state in which one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 7A shows a state in which gates of the transistor Tr1 and the transistor Tr2 are electrically connected to each other and electrically connected to a terminal G.

The transistor 180A shown in FIG. 7A has a function of switching a conduction state and a non-conduction state between the terminal S and the terminal D by changing the potential of the terminal G. Thus, the transistor 180A which is a double-gate transistor functions as one transistor including the transistor Tr1 and the transistor Tr2. In other words, it can be said that in FIG. 7A, one of a source and a drain of the transistor 180A is electrically connected to the terminal S, the other of the source and the drain thereof is electrically connected to the terminal D, and a gate thereof is electrically connected to the terminal G.

Figure 7B:
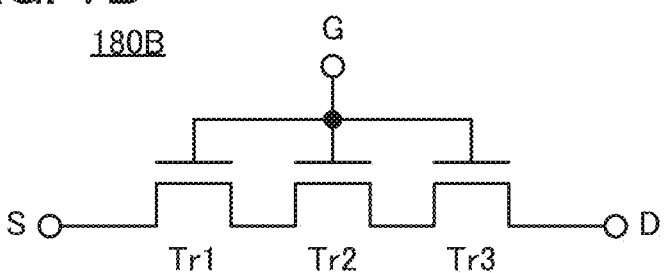

The transistor M1 to the transistor M3 and the transistor M99 may each be a triple-gate transistor. FIG. 7B shows a circuit symbol example of a triple-gate transistor 180B.

The transistor 180B has a structure in which the transistor Tr1, the transistor Tr2, and a transistor Tr3 are connected in series. FIG. 7B shows a state where the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 7B shows a state in which gates of the transistor Tr1, the transistor Tr2, and the transistor Tr3 are electrically connected to each other and electrically connected to the terminal G.

The transistor 180B shown in FIG. 7B has a function of switching a conduction state and a non-conduction state between the terminal S and the terminal D by changing the potential of the terminal G. Thus, the transistor 180B which is a triple-gate transistor functions as one transistor including the transistor Tr1, the transistor Tr2, and the transistor Tr3. In other words, it can be said that in FIG. 7B, one of a source and a drain of the transistor 180B is electrically connected to the terminal S, the other of the source and the drain thereof is electrically connected to the terminal D, and a gate thereof is electrically connected to the terminal G.

Like the transistor 180A and the transistor 180B, a transistor including a plurality of gates electrically connected to each other is referred to as a "multi-gate type transistor" or a "multi-gate transistor" in some cases.

Figure 7C:
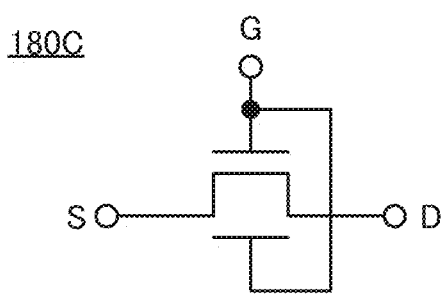
Figure 7D:
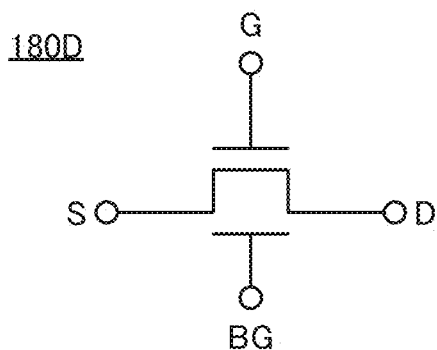

The transistor M1 to the transistor M3 and the transistor M99 may each be a transistor including a back gate. FIG. 7C shows a circuit symbol example of a transistor 180C including a Back Gate. FIG. 7D Shows a Circuit Symbol Example of a Transistor 180D Including a Back Gate.

[Operation Example of Bias-Outputting Unit 112]

An operation example of the bias-outputting unit 112 is described.

[Writing Operation of Bias-Setting Voltage]

Figure 3A:
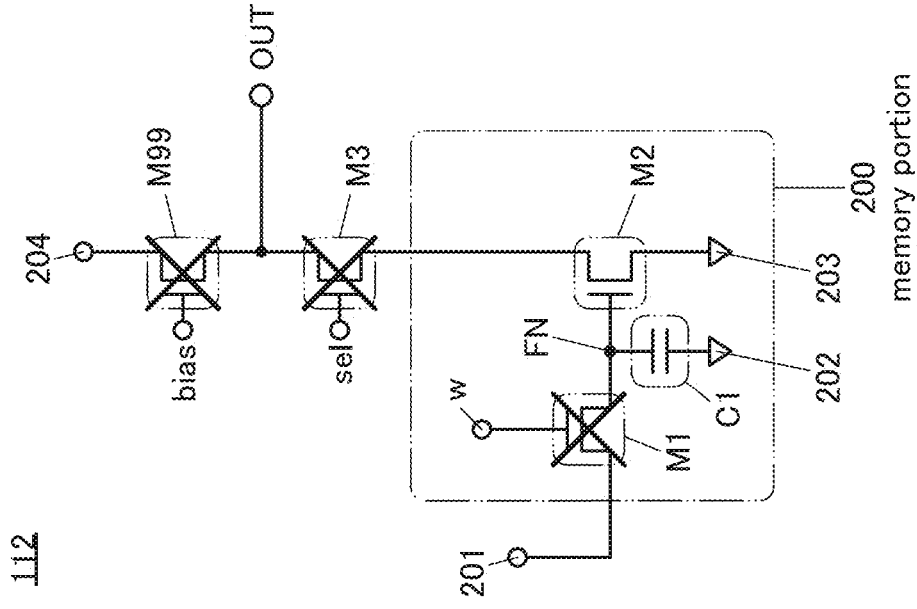
FIG. 3A and FIG. 3B are diagrams showing operation examples of the bias-outputting unit.
Figure 3B:
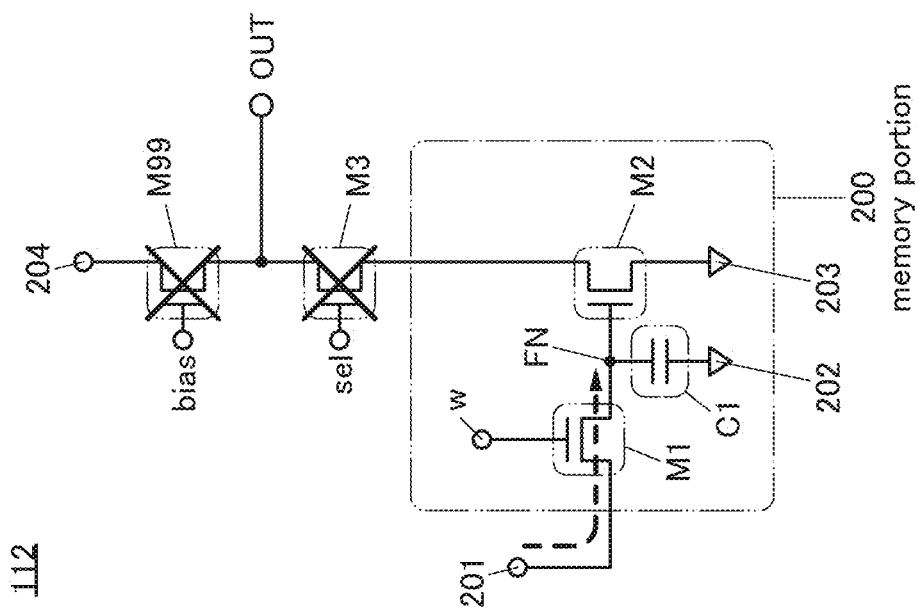

First, an operation of writing a bias-setting voltage to the node FN is described using FIG. 3A and FIG. 3B.

The arithmetic unit 131 determines a bias-setting voltage based on the setting data stored in the memory unit 132, and the bias-setting voltage is supplied to the terminal 201 through the DAC 133.

Next, the terminal w is supplied with a signal to turn on the transistor M1. This makes the terminal 201 and the node FN short-circuited and the bias-setting voltage is written to the node FN (see FIG. 3A).

Next, the terminal w is supplied with a signal to turn off the transistor M1. This makes the node FN be in an electrically floated state (also referred to as "floating state") (see FIG. 3B). The node FN is connected through the capacitor C1 to the terminal 202 which is supplied with a fixed potential, and the potential of the node FN is fixed. As described above, the transistor M1 is preferably an OS transistor. Since the off-state current of an OS transistor is extremely low, the potential of the node FN can be retained for an extremely long time. The memory portion 200 including an OS transistor can be referred to as an "OS memory".

An OS memory using an OS transistor employs a method in which charge is written to the node FN through the OS transistor; hence, high voltage, which a conventional flash memory requires, is unnecessary and a high-speed writing operation is possible. Furthermore, the number of data writing and reading in an OS memory is substantially unlimited because charge injection and extraction into/from a floating gate or a charge trap layer are not performed. An OS memory is less likely to degrade than a conventional flash memory and can have high reliability.

Unlike a magnetic memory, a resistive random access memory, or the like, an OS memory has no change in the structure at the atomic level. Thus, an OS memory has higher rewrite endurance than a magnetic memory and a resistive random access memory.

In FIG. 3A and FIG. 3B, the transistor M3 and the transistor M99 are in the off state. However, in the writing operation, there is no limitation on the state of the transistor M2, the transistor M3, and the transistor M99. The transistors may be in the on state or in the off state.

[Output Operation]

Next, the operation of supplying a voltage (bias signal), corresponding to the bias-setting voltage written to the node FN, to the terminal OUT is described with reference to FIG. 4A and FIG. 4B.

In the initial states, the transistor M1, the transistor M3, and the transistor M99 are in the off states. The terminal 204 is supplied with VDD and the terminal 203 is supplied with VSS. First, the terminal sel is supplied with a bias-selecting signal. The bias-selecting signal is a signal which turns on the transistor M3 (see FIG. 4A).

Figure 4B:
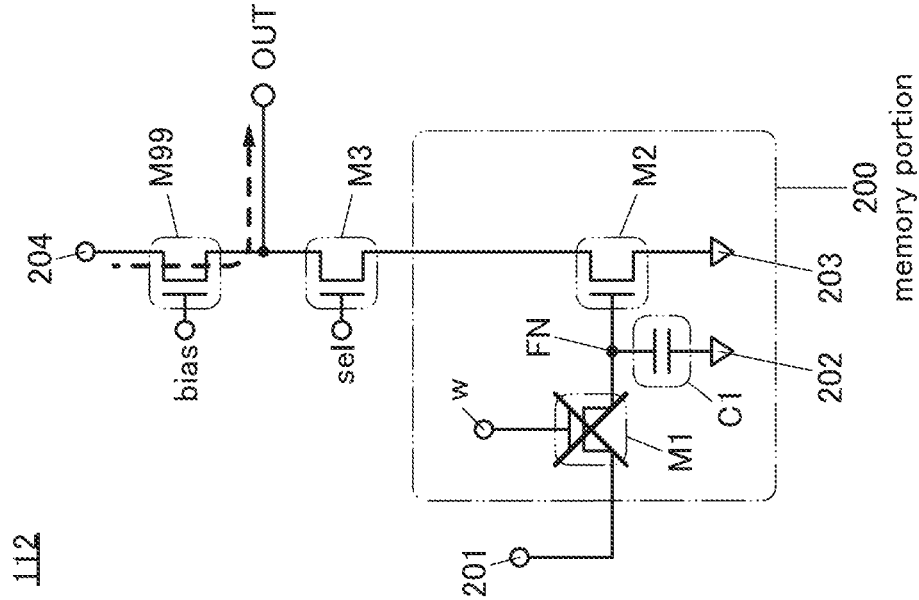
FIG. 4A and FIG. 4B are diagrams showing operation examples of the bias-outputting unit.
Figure 4A:
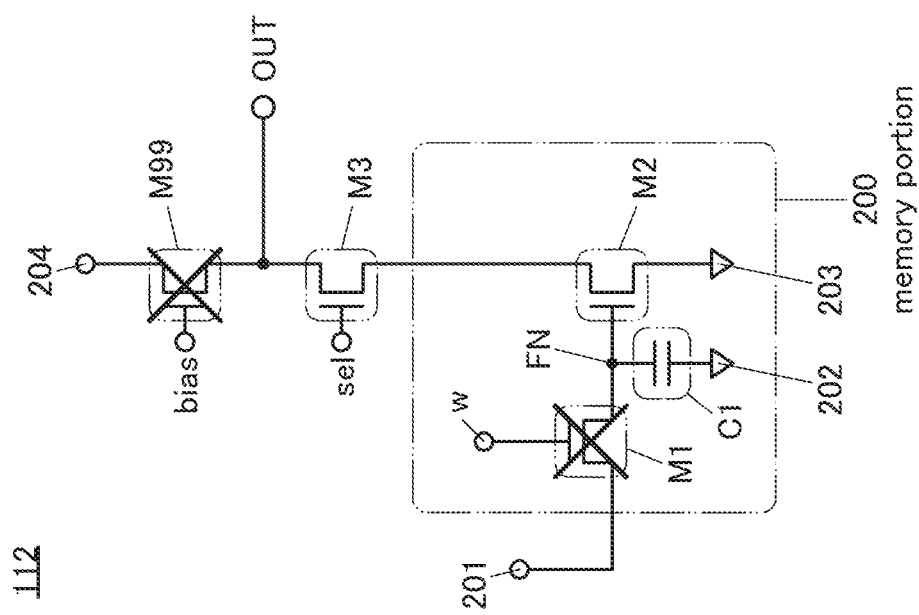

Next, the terminal bias is supplied with a signal which turns on the transistor M99 (see FIG. 4B). When the voltage of the terminal OUT is $V_{OUT}$, the resistance value between the source and the drain of the transistor M2 is RA, the resistance value between the source and the drain of the transistor M3 is RB, and the resistance value of the transistor M99 is RC, $V_{OUT}$ can be expressed by Formula 1.

[Formula 1]

$$V_{OUT} = \frac{RA + RB}{RA + RB + RC} \times (VDD - VSS) \quad (1)$$

For example, assuming that VDD is 5 V, VSS is 0 V, RA is 300 kΩ, RB is 100 kΩ, and RC is 100 kΩ, $V_{OUT}$ is 4 V. Since RA is determined by the magnitude of the bias-setting voltage retained in the node FN, $V_{OUT}$ can be changed by changing the bias-setting voltage retained in the node FN. The transistor M2 preferably operates in a linear region.

The bias-outputting unit 112 shown in FIG. 2A and FIG. 2B can supply two voltages, the voltage determined by the bias-setting voltage and VDD, to the terminal OUT. The more memory portions 200 and transistors M3 are provided to the bias-outputting unit 112, the more voltages can be supplied to the terminal OUT.

Figure 5:
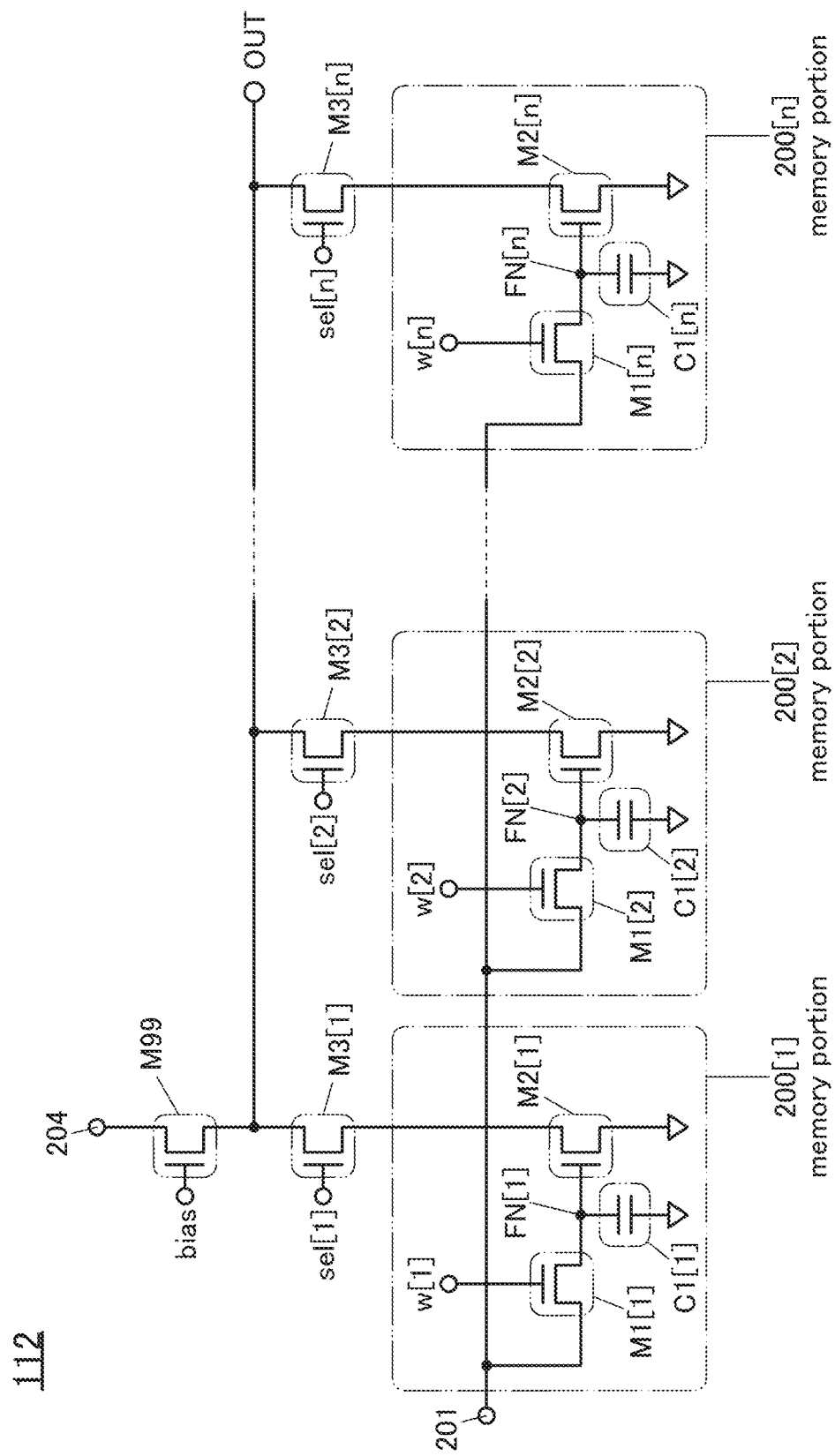
FIG. 5 is a diagram showing a circuit structure example of the bias-outputting unit.

FIG. 5 shows a circuit structure example of the bias-outputting unit 112 including one transistor M99, n memory portion(s) 200, and n transistor(s) M3. In FIG. 5, the third to the n−1-th memory portion 200 and the third to the n−1-th transistor M3 are omitted.

FIG. 5 shows the first memory portion 200 as the memory unit 200[1] and the first transistor M3 as the transistor M3[1]. The transistor M1, the transistor M2, the capacitor C1, and the node FN included in the memory portion 200[1] are shown as the transistor M1[1], the transistor M2[1], the capacitor C1[1], and the node FN[1]. The terminal w connected to a gate of the transistor M1[1] and the terminal sel connected to a gate of the transistor M3[1] are shown as the terminal w[1] and the terminal sel[1], respectively. The second to the n-th memory portion 200 can be similarly shown.

Figure 6:
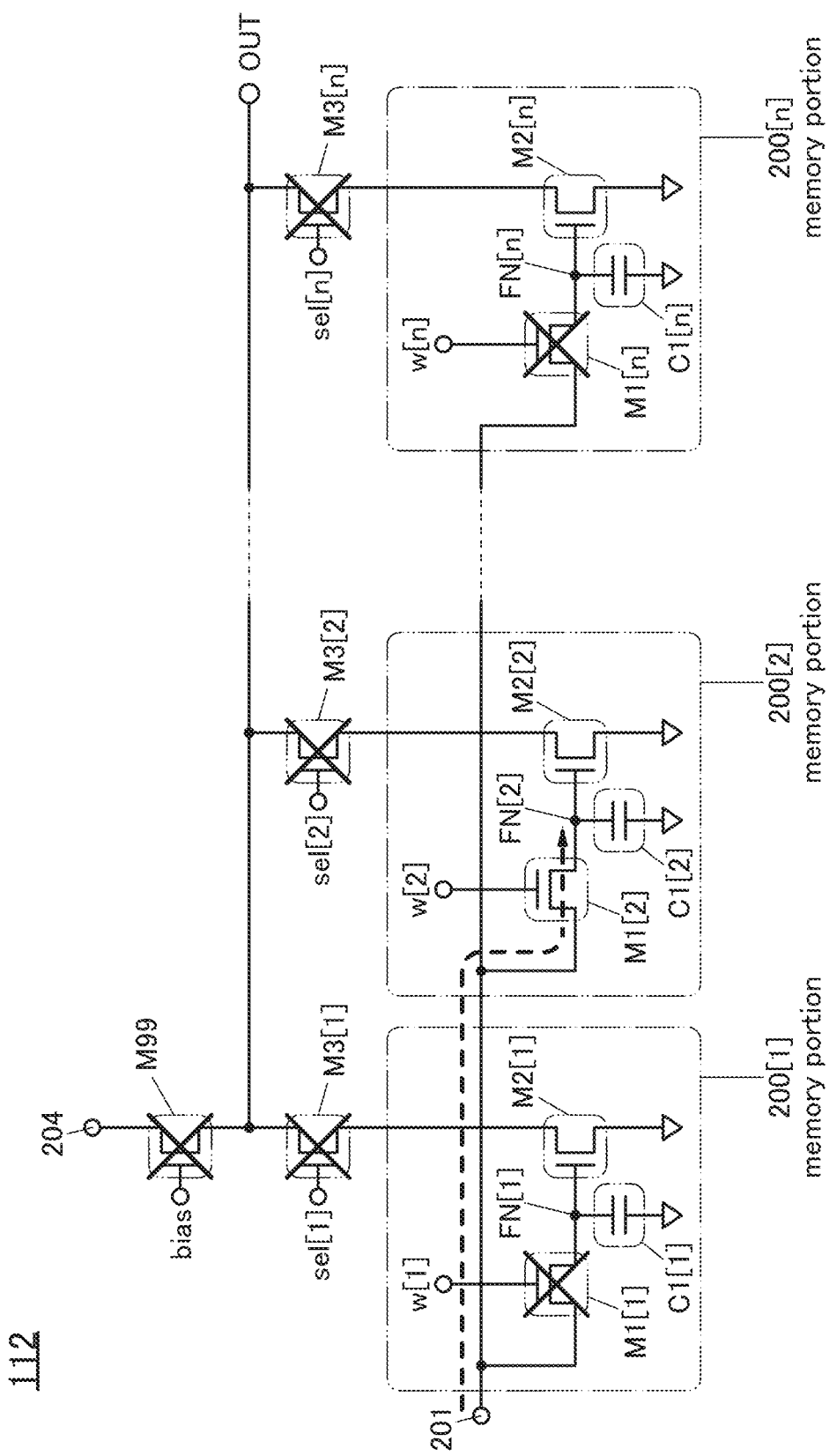
FIG. 6 is a diagram showing an operation example of the bias-outputting unit.

The arithmetic unit 131 can write a bias-setting voltage to any memory portion 200 by appropriately selecting a voltage supplied to the terminal w[1] to the terminal w[n]. For example, when a bias-setting voltage is written to the memory portion 200[2], a voltage to turn off the transistor is supplied to the terminal w[1] and the terminal w[3] to the terminal w[n], and a signal to turn on the transistor is supplied to the terminal w[2] (see FIG. 6).

The arithmetic unit 131 can output to the terminal OUT a voltage corresponding to the bias-setting voltage stored in a memory portion 200 by appropriately selecting a voltage supplied to the terminal sel [1] to the terminal sel [n].

Note that the structure of the semiconductor device 100 shown in FIG. 1 is merely an example, and all of the components are not necessarily included. It is acceptable as long as the semiconductor device 100 include necessary components among the components shown in FIG. 1. A component other than the components shown in FIG. 1 may be included.

<Operational Example of Semiconductor Device>

Figure 8:
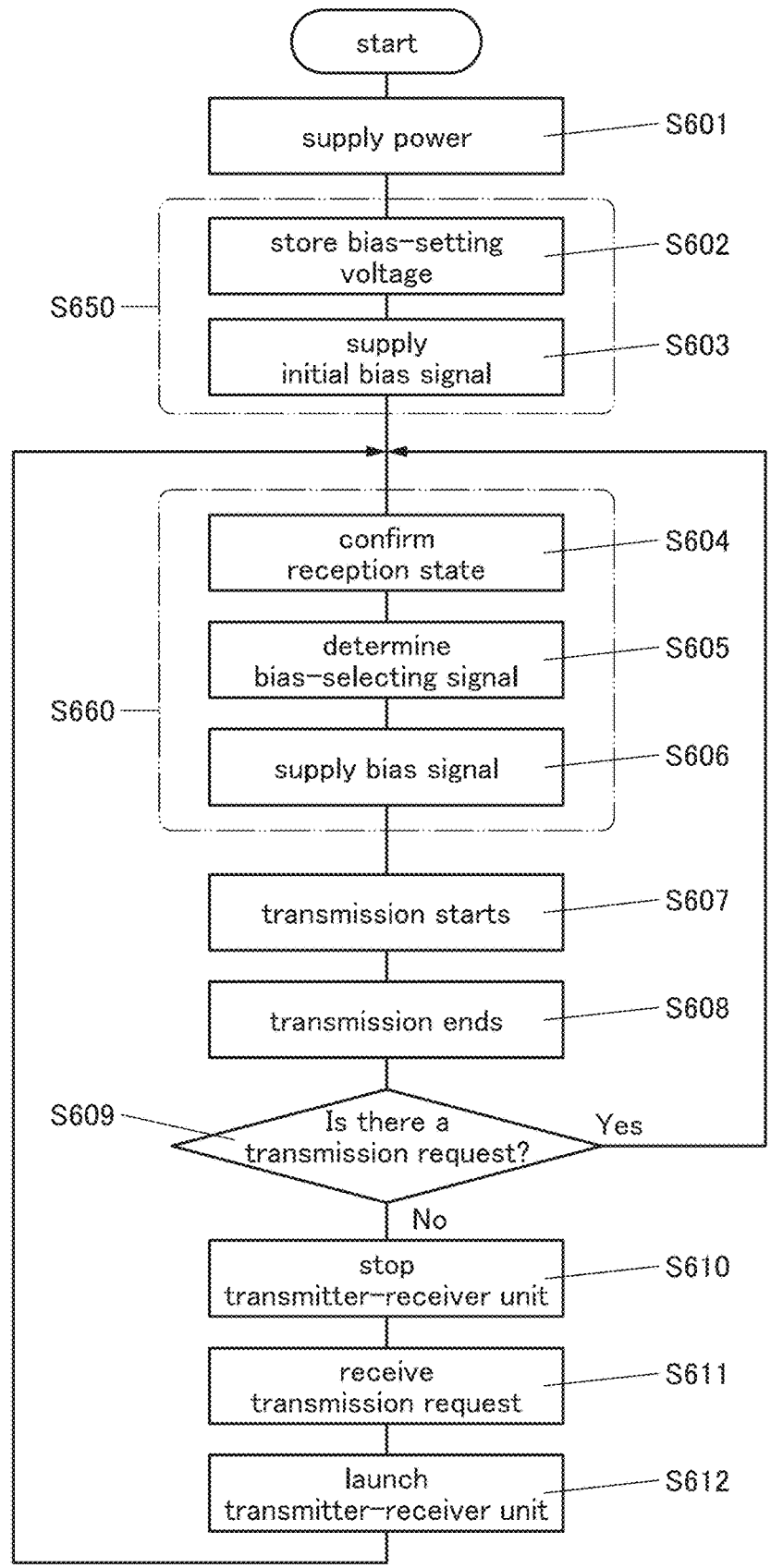
FIG. 8 is a flow chart showing an operation example of the semiconductor device.

Next, the operational example of the semiconductor device 100 is described. FIG. 8 is a flow chart describing an operational example of the semiconductor device 100.

First, the semiconductor device 100 is supplied with power (power supply) to be launched (Step S601).

Next, initialization operations are performed (Step S650). Specifically, at first, the arithmetic unit 131 determines n bias-setting voltage(s) based on the setting data stored in the memory unit 132. Next, then bias-setting voltage(s) is supplied to the bias-outputting unit 112 through the DAC 133. The bias-outputting unit 112 stores the n bias-setting voltage(s) in the n memory portion(s) 200. One memory portion 200 stores one bias-setting voltage (Step S602).

When an OS memory is used in the memory portion 200, a written (stored) bias-setting voltage can be retained for a long time. This enables power supply to the DAC 133 to stop after writing the bias-setting voltage. Thus, the power consumption of the semiconductor device 100 can be reduced.

Next, an initial bias signal is supplied to the transmitter unit 111 (Step S603). The arithmetic unit 131 selects one bias-setting voltage which is stored in the bias-outputting unit 112. The bias-outputting unit 112 supplies to the transmitter unit 111 a bias signal corresponding to the selected bias-setting voltage. The bias signal supplied at this time is the initial bias signal.

The initial bias signal is a bias signal to increase the transmission power to the extent to which transmission can be conducted. The initial bias signal is preferably a bias signal to maximize the transmission power.

Next, the transmission power is optimized (Step S660). First, the reception state is confirmed (Step S604). For example, the transmission power is reset in accordance with the value of transmission power (request signal) requested by a base station. The receiver unit 113 supplies a request signal to the arithmetic unit 131. The arithmetic unit 131 compares the request signal and the setting signal stored in the memory unit 132 to determine the bias-selecting signal (Step S605).

Then, the arithmetic unit 131 supplies the determined bias-selecting signal to the bias-outputting unit 112. The bias-outputting unit 112 supplies a bias signal corresponding to the bias-selecting signal to the transmitter unit 111. The transmission power can be optimized in this manner (Step S606).

Next, the transmission starts (Step S607). For example, an audio signal input to the converter unit 120 is converted into an electric signal to be transmitted by the transmitter-receiver unit 110 and emitted from the antenna 150. Alternatively, data output from an internal circuit of a terminal device including the controller unit 130 and the transmitter-receiver unit 110 is converted into a signal which can be transmitted by the transmitter-receiver unit 110 and emitted from the antenna 150.

After the required transmission data is transmitted, transmission is finished (Step S608).

When an external device such as a base station requests transmission or an internal circuit of a terminal device including the controller unit 130 and the transmitter-receiver unit 110 requests transmission, Step S660 is conducted again (Step S609). If there is no request for transmission, the controller unit 130 stops supplying power to the transmitter unit 111 and the bias-outputting unit 112 to reduce power consumption (Step S610).

When transmission is requested after the operations of the circuits of the transmitter unit 111 and the bias-outputting unit 112 stop (Step S611), the controller unit 130 starts the transmitter unit 111 and the bias-outputting unit 112 (Step S612).

By using the OS memory in the memory portion 200 in the bias-outputting unit 112, the bias-setting voltage written to the bias-outputting unit 112 can be retained even after power supply is stopped at Step S610. Therefore, the initialization operations (Step S650) are not needed after Step S612.

After Step S612, transmission power is optimized (Step S660).

<Modification Example of Semiconductor Device>

Figure 9:
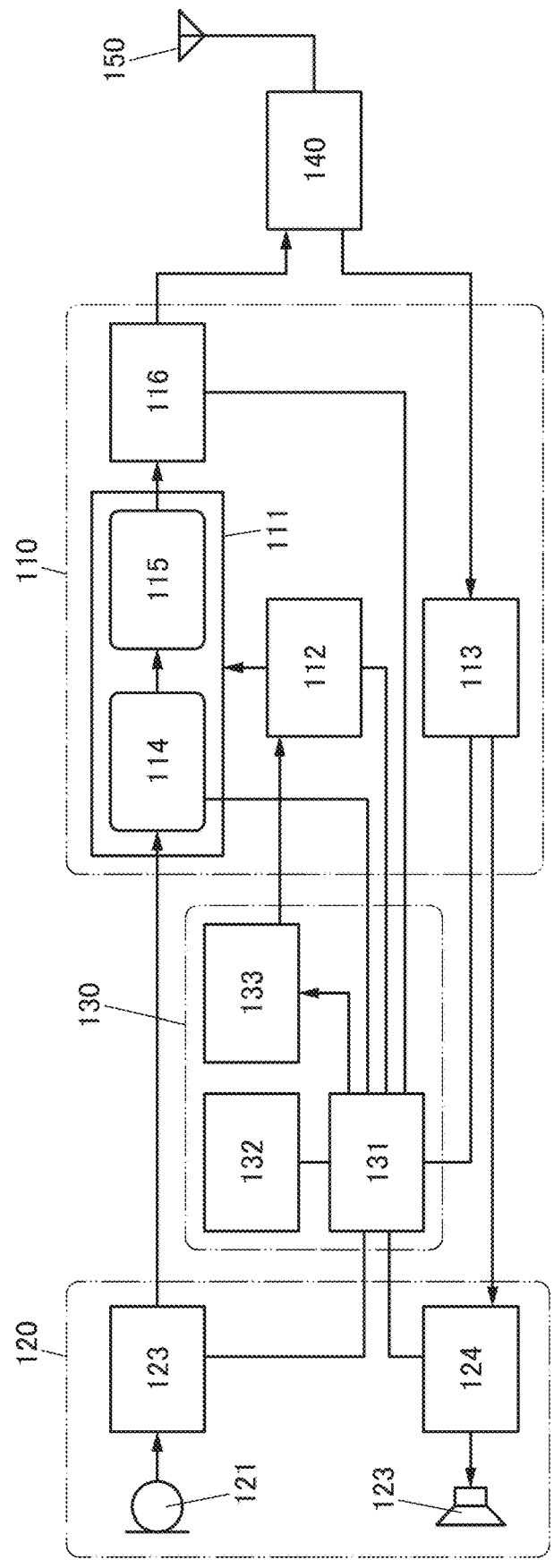
FIG. 9 is a diagram showing a structure example of a semiconductor device.

FIG. 9 shows a structure example of a semiconductor device 100A, which is a modification example of the semiconductor device 100. The semiconductor device 100A is different from the semiconductor device 100 in including a power detector unit 116 between the transmitter unit 111 and the duplexer 140.

The power detector unit 116 is electrically connected to the arithmetic unit 131. The power detector unit 116 has a function of detecting the magnitude of transmission power output from the transmitter unit 111. The arithmetic unit 131 has a function of comparing the setting data stored in the memory unit 132 and data obtained by the power detector unit 116, for example. The arithmetic unit 131 uses a comparison result to adjust a bias signal which is supplied to the transmitter unit 111.

With the power detector unit 116, transmission power can be adjusted even with no request signal from a base station. In this embodiment, the power detector unit 116 is provided in the transmitter-receiver unit 110; the power detector unit 116 may be provided outside the transmitter-receiver unit 110.

This embodiment can be implemented in combination with any of the structures described in the other embodiments and the like, as appropriate.

Embodiment 2

In this embodiment, structures of transistors that can be used in the semiconductor device described in the above embodiments are described. As an example, a configuration in which transistors having different electrical characteristics are stacked is described. With the structure, the degree of freedom in design of the semiconductor device can be increased. Stacking transistors having different electrical characteristics can increase the degree of integration of the semiconductor device.

Figure 10:
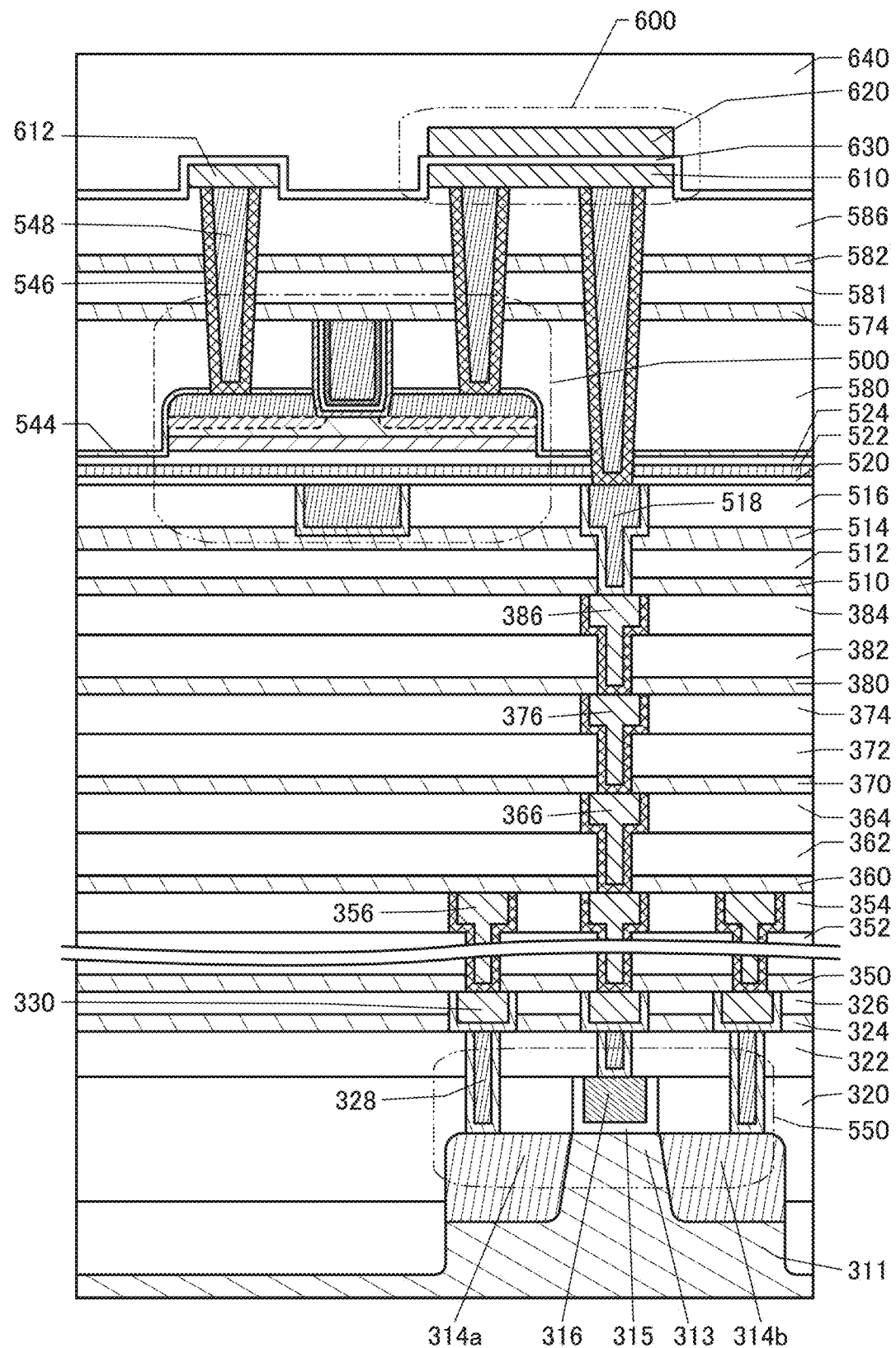
FIG. 10 is a circuit diagram showing a structure example of a semiconductor device.
Figure 12A:
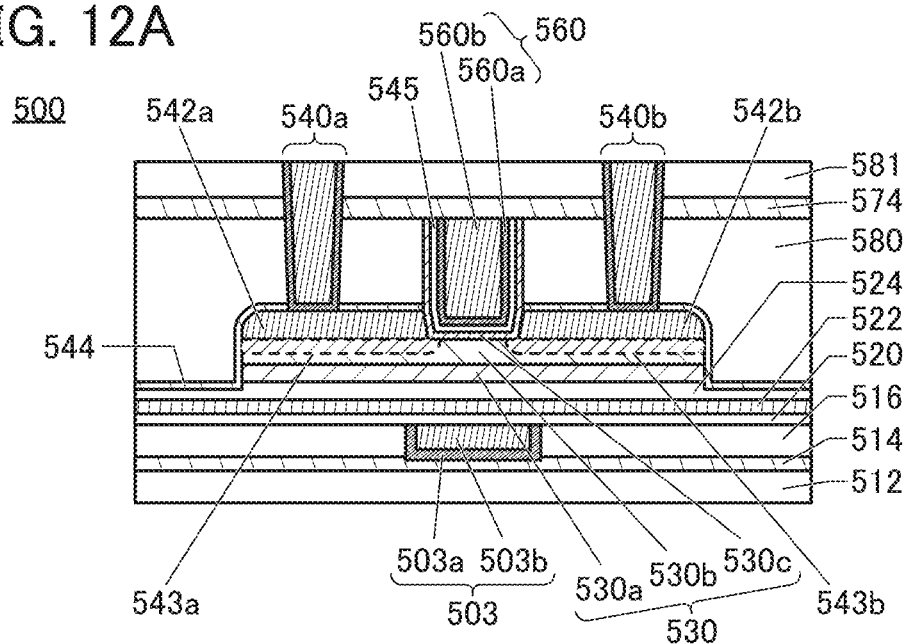
FIG. 12A to FIG. 12C are diagrams showing a transistor structure example.
Figure 12B:
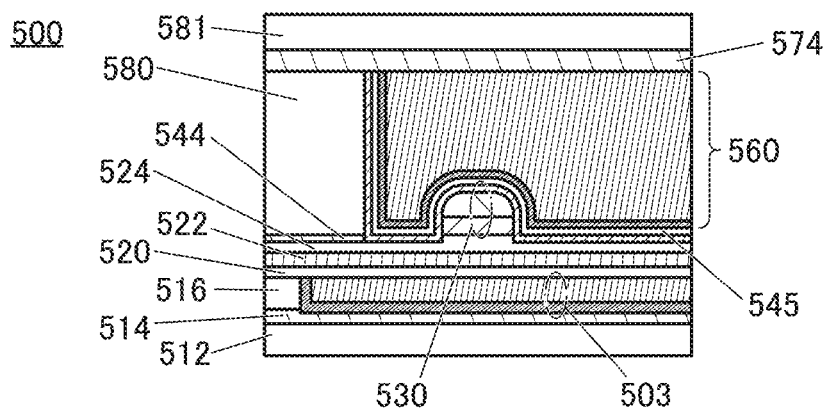
Figure 12C:
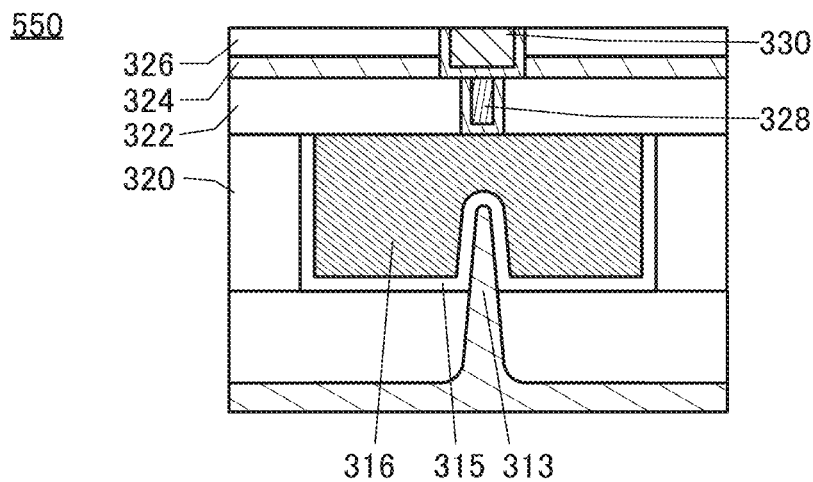

FIG. 10 shows part of a cross-sectional structure of a semiconductor device. A semiconductor device shown in FIG. 10 includes a transistor 550, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 550 in the channel width direction. For example, the transistor 500 and the transistor 550 correspond to the transistor M1 and the transistor M2, respectively, described in the above embodiment. The capacitor 600 corresponds to the capacitor C1.

The transistor 500 is an OS transistor. The transistor 500 has extremely small off-state current. Accordingly, data voltage or charge written to a storage node through the transistor 500 can be retained for a long time. In other words, power consumption of the semiconductor device can be reduced because a memory node has a low frequency of refresh operation or requires no refresh operation.

In FIG. 10, the transistor 500 is provided above the transistor 550, and the capacitor 600 is provided above the transistor 550 and the transistor 500.

The transistor 550 is provided over a substrate 311 and includes a conductor 316, an insulator 315, a semiconductor region 313 that is part of the substrate 311, and a low-resistance region 314a and a low-resistance region 314b each functioning as a source region or a drain region.

As shown in FIG. 12C, in the transistor 550, a top surface and a side surface in the channel width direction of the semiconductor region 313 are covered with the conductor 316 with the insulator 315 therebetween. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 11:
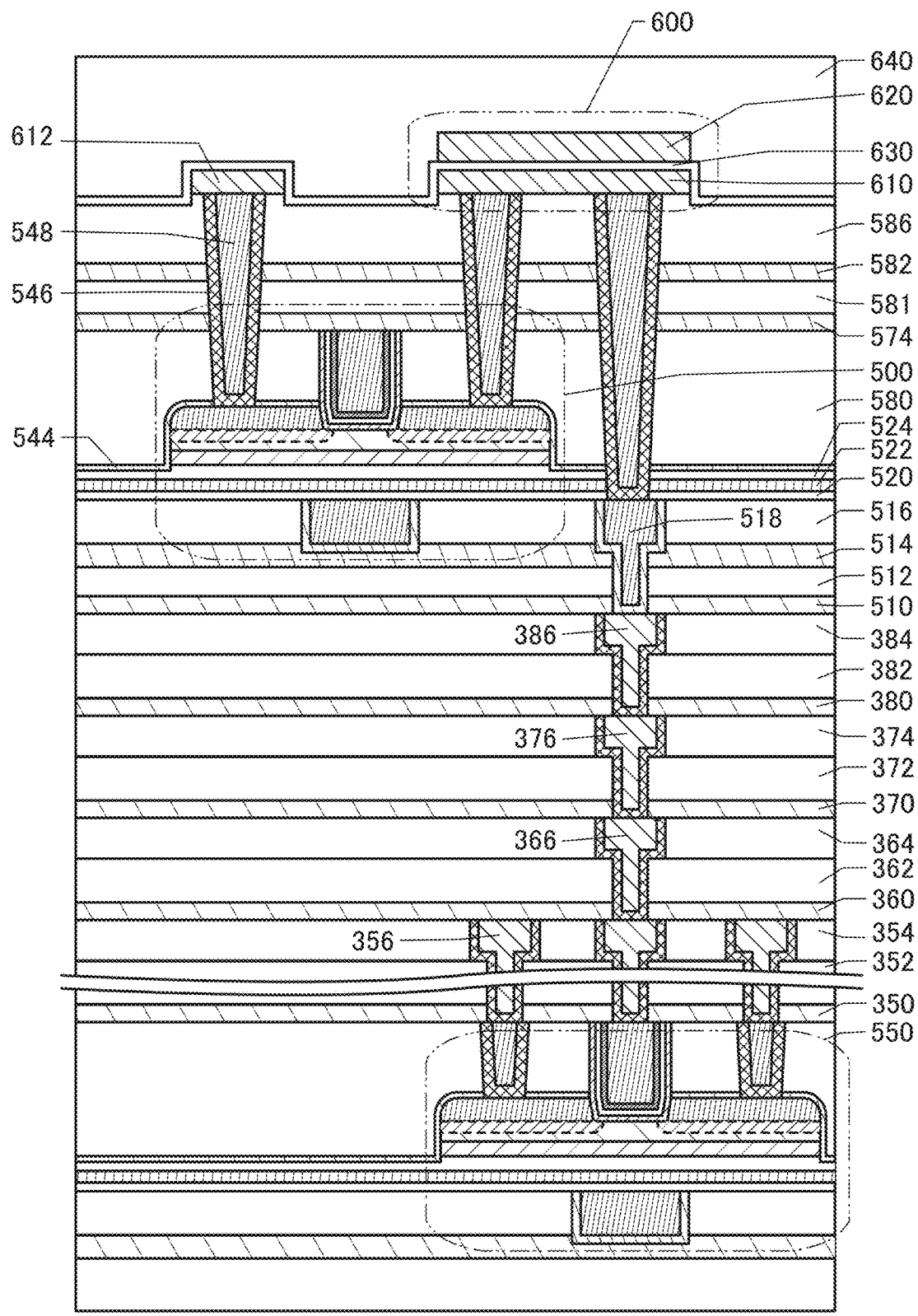
FIG. 11 is a circuit diagram showing a structure example of a semiconductor device.

Note that the transistor 550 shown in FIG. 10 is an example and the configuration is not limited thereto; an appropriate transistor can be used in accordance with a circuit configuration or a driving method. In the case where all the transistors included in the semiconductor device are the OS transistors and have the same conductivity, which means the same-polarity transistors such as n-channel transistors only, for example, the transistor 550 has a structure similar to that of the transistor 500 including an oxide semiconductor as shown in FIG. 11. Note that the details of the transistor 500 are described later.

An insulator 320, an insulator 322, an insulator 324, and an insulator 326 are stacked sequentially to cover the transistor 550.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 550, or the like into a region where the transistor 500 is provided.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 10, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a configuration in which a tantalum nitride layer having a barrier property against hydrogen is in contact with the insulator 350 having a barrier property against hydrogen is preferable.

A wiring layer may be provided over the insulator 354 and the conductor 356. For example, in FIG. 10, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 10, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 374 and the conductor 376. For example, in FIG. 10, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 550 is provided, or the like into the region where the transistor 500 is provided. Therefore, a material similar to that for the insulator 324 can be used.

For the film having a barrier property against hydrogen, silicon nitride formed using a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As shown in FIG. 12A and FIG. 12B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an oxide 530c positioned on a bottom and a side surface of the opening; an insulator 545 positioned on a formation surface of the oxide 530c; and a conductor 560 positioned on a formation surface of the insulator 545.

In addition, as shown in FIG. 12A and FIG. 12B, an insulator 544 is preferably positioned between the insulator 580 and the oxide 530a, the oxide 530b, the conductor 542a, and the conductor 542b. Furthermore, as shown in FIG. 12A and FIG. 12B, the conductor 560 preferably includes a conductor 560a provided inside the insulator 545 and a conductor 560b provided to be embedded inside the conductor 560a. Moreover, as shown in FIG. 12A and FIG. 12B, an insulator 574 is preferably positioned over the insulator 580, the conductor 560, and the insulator 545.

Note that in this specification and the like, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Note that the transistors 500 shown in FIG. 10, FIG. 11, and FIG. 12A are examples, and the structures are not limited thereto; an appropriate transistor can be used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. Furthermore, in this specification and the like, the surrounded channel (S-channel) structure has a feature in that the side surface and the vicinity of the oxide 530 that is in contact with the conductor 542a and the conductor 542b functioning as a source electrode and a drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is unlikely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, $V_OH$ in the oxide 530 is preferably reduced as much as possible so that the oxide 530 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose $V_OH$ is sufficiently reduced. When an oxide semiconductor with sufficiently reduced impurities such as $V_OH$ is used for a channel formation region of a transistor, the transistor can have stable electrical characteristics.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^{-3}$, preferably greater than or equal to $1.0 \times 10^{19}$ atoms/cm$^{-3}$, further preferably greater than or equal to $2.0 \times 10^{19}$ atoms/cm$^{-3}$ or greater than or equal to $3.0 \times 10^{20}$ atoms/cm$^{-3}$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O + H$ occurs. Part of hydrogen generated at this time is bonded to oxygen to be $H_2O$, and removed from the oxide 530 or an insulator near the oxide 530 in some cases. Some hydrogen may be gettered into the conductor 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of $V_O + O \rightarrow$ null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 12A and FIG. 12B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Note that the metal oxide functioning as an oxide semiconductor will be described in detail in another embodiment.

Furthermore, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used for the oxide 530a or the oxide 530b can be used for the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the densities of defect states in mixed layers formed at an interface between the oxide 530a and the oxide 530b and an interface between the oxide 530b and the oxide 530c are preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 12, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 12A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 545 can be inhibited. Furthermore, oxidation of the conductor 560 due to excess oxygen contained in the insulator 580 can be inhibited.

The insulator 545 functions as a first gate insulating film. The insulator 545 is preferably positioned in contact with an inner side (a top surface and a side surface) of the oxide 530c. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 545 in contact with the top surface of the oxide 530c, oxygen can be effectively supplied from the insulator 545 to the channel formation region of the oxide 530b through the oxide 530c. Furthermore, as in the insulator 524, the concentration of impurities such as water or hydrogen in the insulator 545 is preferably reduced. The thickness of the insulator 545 is preferably greater than or equal to 1 nm and less than or equal to 20 nm.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 to the conductor 560. Providing the metal oxide that inhibits diffusion of oxygen inhibits diffusion of excess oxygen from the insulator 545 to the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 that functions as the first gate electrode and has a two-layer structure is shown in FIG. 12A and FIG. 12B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 545. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using materials similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a SOI (Silicon on Insulator) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, paper, and the like. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. After part or the whole of a semiconductor device is completed over the separation layer, the separation layer can be used for separation from the substrate and transfer to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

Modification Example 1 of Transistor

Figure 13A:
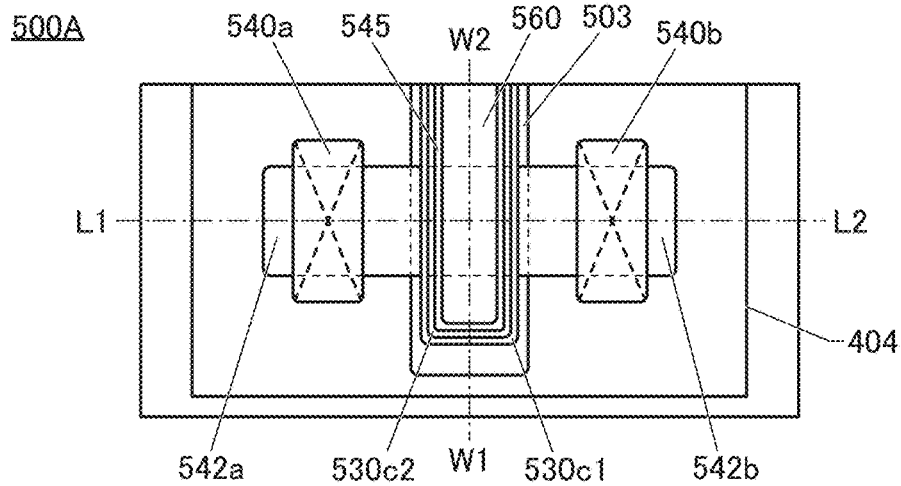
FIG. 13A to FIG. 13C are diagrams showing a transistor structure example.
Figure 13B:
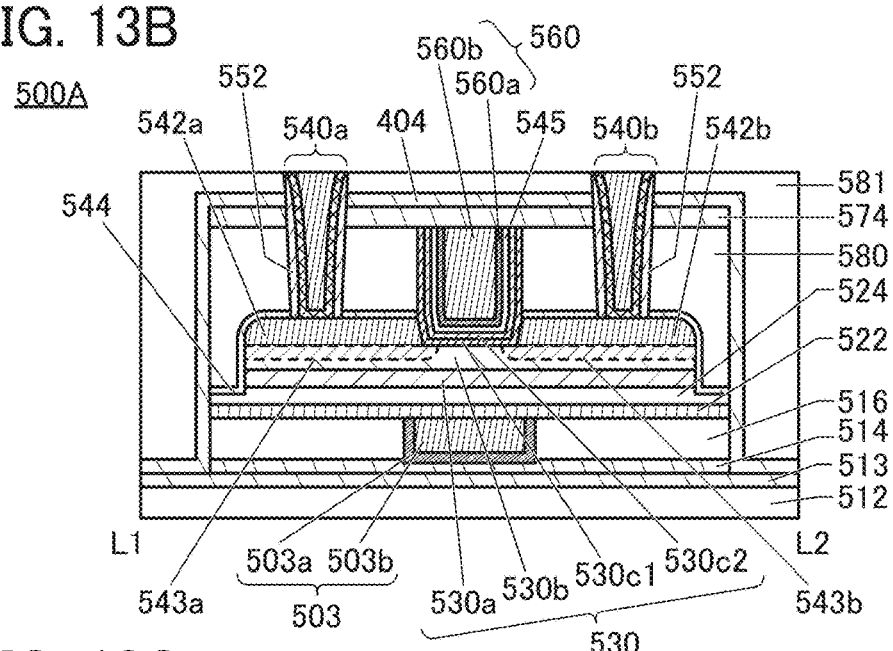
Figure 13C:
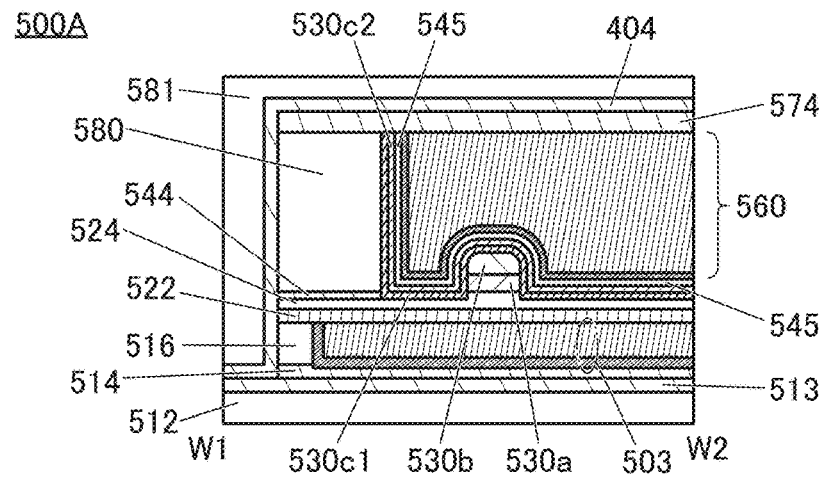

A transistor 500A shown in FIG. 13A, FIG. 13B, and FIG. 13C is a modification example of the transistor 500 having the structure shown in FIG. 12A and FIG. 12B. FIG. 13A is a top view of the transistor 500A and FIG. 13B is a cross-sectional view of the transistor 500A in the channel length direction. FIG. 13C is a cross-sectional view of the transistor 500A in the channel width direction. The structure shown in FIG. 13A, FIG. 13B, and FIG. 13C can also be used for other transistors such as the transistor 550 included in the semiconductor device of one embodiment of the present invention.

The transistor 500A having the structure shown in FIG. 13A, FIG. 13B, and FIG. 13C is different from the transistor 500 having the structure shown in FIG. 12A and FIG. 12B in including an insulator 552, an insulator 513, and an insulator 404 and including the oxide 530c having a stack of an oxide 530c1 and an oxide 530c2. Furthermore, the transistor 500A having the structure shown in FIG. 13A, FIG. 13B, and FIG. 13C is different from the transistor 500 having the structure shown in FIG. 12A and FIG. 12B in that the insulator 552 is provided in contact with a side surface of the conductor 540a and a side surface of the conductor 540b. Moreover, the transistor 500A having the structure shown in FIG. 13A, FIG. 13B, and FIG. 13C is different from the transistor 500 having the structure shown in FIG. 12A and FIG. 12B in that the insulator 520 is not included.

In the transistor 500A having the structure shown in FIG. 13A, FIG. 13B, and FIG. 13C, the insulator 513 is provided over the insulator 512. The insulator 404 is provided over the insulator 574 and the insulator 513.

In the transistor 500A having the structure shown in FIG. 13A, FIG. 13B, and FIG. 13C, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of a hydrogen atom, a hydrogen molecule, and the like) or a water molecule. For example, for the insulator 513 and the insulator 404, silicon nitride or silicon nitride oxide that is a material having a high hydrogen barrier property is preferably used. This can inhibit diffusion of hydrogen or the like into the oxide 530, thereby suppressing the degradation of the characteristics of the transistor 500A. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride as the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. As described above, the reliability of the semiconductor device of one embodiment of the present invention can be increased.

The oxide 530c1 is in contact with the top surface of the insulator 524, the side surface of the oxide 530a, the top surface and the side surface of the oxide 530b, the side surfaces of the conductor 542a and the conductor 542b, the side surface of the insulator 544, and the side surface of the insulator 580 (see FIG. 13B and FIG. 13C). The oxide 530c2 is in contact with the insulator 545.

An In—Zn oxide can be used as the oxide 530c1, for example. As the oxide 530c2, it is possible to use a material similar to a material used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example.

Modification Example 2 of Transistor

Figure 14A:
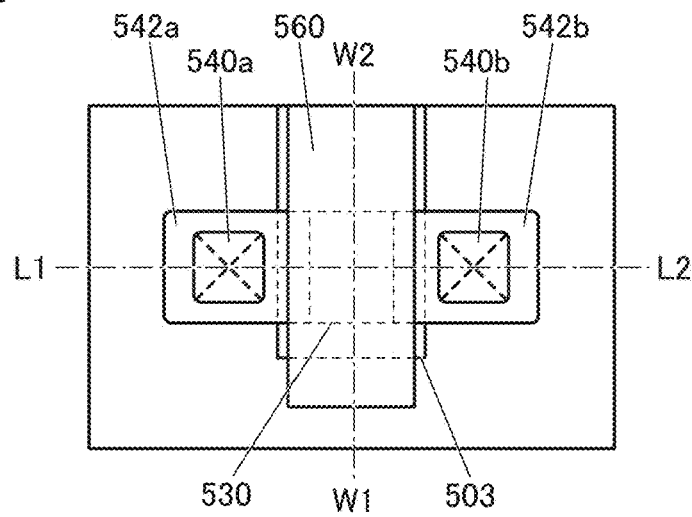
FIG. 14A to FIG. 14C are diagrams showing a transistor structure example.
Figure 14B:
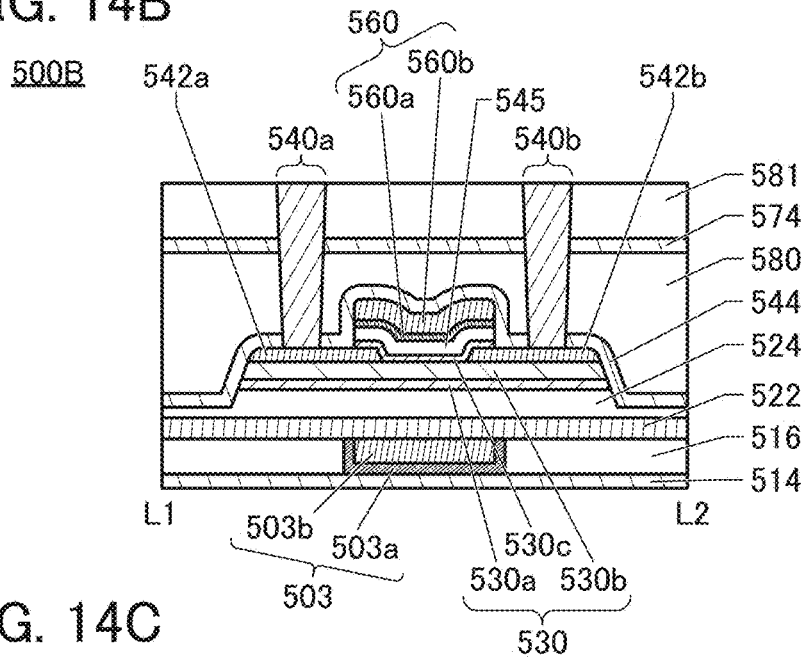
Figure 14C:
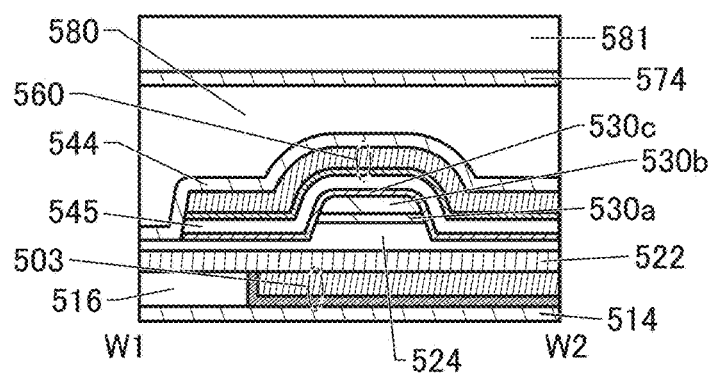

A structure example of a transistor 500B is described with reference to FIG. 14A, FIG. 14B, and FIG. 14C. FIG. 14A is a top view of the transistor 500B. FIG. 14B is a cross-sectional view of a portion indicated by dashed-dotted line L1-L2 in FIG. 14A. FIG. 14C is a cross-sectional view of a portion indicated by a dashed-dotted line W1-W2 in FIG. 14A. Note that for clarity of the drawing, some components are not shown in the top view of FIG. 14A.

The transistor 500B is a modification example of the transistor 500 and can be replaced with the transistor 500. Therefore, differences from the transistor 500B are mainly described to avoid repeated description.

The conductor 560 functioning as a first gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be extended. That is, the conductor 560a inhibits oxidation of the conductor 560b, thereby preventing the decrease in conductivity.

The insulator 544 is preferably provided to cover the top surface and the side surface of the conductor 560, a side surface of the insulator 545, and a side surface of the oxide 530c. For the insulator 544, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 544 can inhibit oxidation of the conductor 560. Moreover, the insulator 544 can inhibit diffusion of impurities such as water and hydrogen contained in the insulator 580 into the transistor 500B.

The transistor 500B has the conductor 560 overlapping part of the conductor 542*a* and part of the conductor 542*b*, and thus tends to have larger parasitic capacitance than the transistor 500. Consequently, the transistor 500B tends to have a lower operating frequency than the transistor 500. However, the transistor 500B does not require steps of providing an opening in the insulator 580 and the like and embedding the conductor 560, the insulator 545, and the like in the opening; hence, the productivity of the transistor 500B is higher than that of the transistor 500.

This embodiment can be implemented in combination with any of the structures described in the other embodiments and the like, as appropriate.

Embodiment 3

In this embodiment, oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, classifications of the crystal structures of an oxide semiconductor will be described with reference to FIG. 15A. FIG. 15A is a diagram showing classifications of crystal structures of an oxide semiconductor, typically IGZO (metal oxide containing In, Ga, and Zn).

As shown in FIG. 15A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 15A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 15B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 15B and obtained by GIXD measurement is hereinafter simply referred to as an XRD spectrum. The CAAC-IGZO film in FIG. 15B has a composition in the vicinity of In:Ga:Zn=4:2:3 [atomic ratio]. The CAAC-IGZO film in FIG. 15B has a thickness of 500 nm.

As shown in FIG. 15B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 15B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 15C shows a diffraction pattern of the CAAC-IGZO film. FIG. 15C shows a diffraction pattern obtained with the NBED method in which an electron beam is incident in the direction parallel to the substrate. The composition of the CAAC-IGZO film in FIG. 15C is In:Ga:Zn=4:2:3 [atomic ratio] or the neighborhood thereof. In the nanobeam electron diffraction method, electron diffraction is performed with a probe diameter of 1 nm.

As shown in FIG. 15C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 15A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable.

Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is lower than or equal to $1\times10^{18}$ atoms/cm$^{-3}$, preferably lower than or equal to $2\times10^{16}$ atoms/cm$^{-3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

This embodiment can be implemented in combination with any of the structures described in the other embodiments and the like, as appropriate.

Embodiment 4

In this embodiment, electronic devices in which the semiconductor device of one embodiment of the present invention can be used will be described.

The semiconductor device of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. Vehicles such as an automobile, a bicycle, a ship, and an airplane can also be categorized as electronic devices. The semiconductor device of one embodiment of the present invention can be used for communication devices in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of an electronic device including the semiconductor device of one embodiment of the present invention are described with reference to drawings.

Figure 16A:
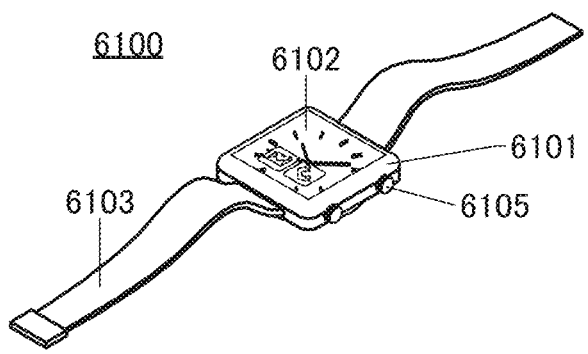
FIG. 16A to FIG. 16E are diagrams showing examples of electronic devices.

FIG. 16A shows an example of a wrist-watch-type portable information terminal. A portable information terminal 6100 includes a housing 6101, a display portion 6102, a band 6103, operation buttons 6105, and the like. The portable information terminal 6100 includes a secondary battery and a communication device therein. When the semiconductor device of one embodiment of the present invention is used in the portable information terminal 6100, the power consumption by the portable information terminal 6100 can be reduced.

Figure 16B:
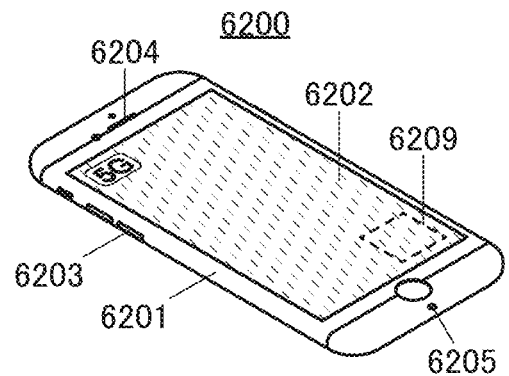

FIG. 16B shows an example of a mobile phone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 includes a secondary battery and a communication device therein. When the semiconductor device of one embodiment of the present invention is used in the portable information terminal 6200, the power consumption by the portable information terminal 6200 can be reduced.

Figure 16C:
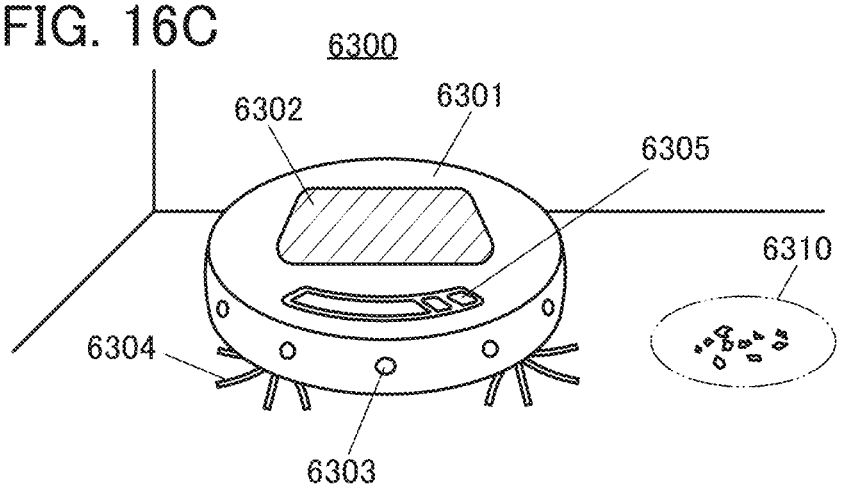

FIG. 16C shows an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not shown, a cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 includes a secondary battery and a communication device therein. When the semiconductor device of one embodiment of the present invention is used in the cleaning robot 6300, the power consumption by the cleaning robot 6300 can be reduced.

Figure 16D:
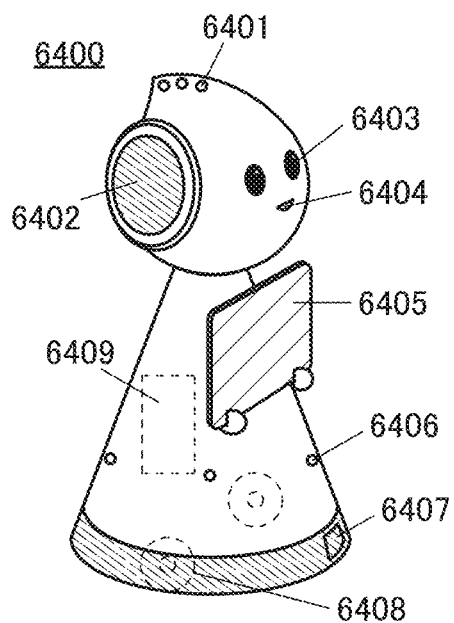

FIG. 16D shows an example of a robot. A robot 6400 shown in FIG. 16D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 also has a function of outputting sound. The robot 6400 can communicate with a user using the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect, with the use of the moving mechanism 6408, the presence of an obstacle in the direction where the robot 6400 advances. The robot 6400 can move safely by recognizing the surroundings with the upper camera 6403, the lower camera 6406, and the obstacle sensor 6407. The light-emitting device of one embodiment of the present invention can be used for the display portion 6405.

Figure 16E:
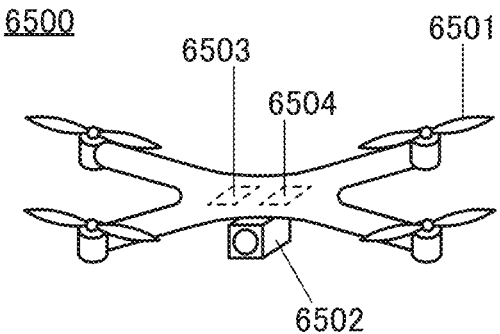

The robot 6400 includes a secondary battery and a communication device therein. When the semiconductor device of one embodiment of the present invention is used in the robot 6400, the power consumption by the robot 6400 can be reduced FIG. 16E shows an example of a flying object. A flying object 6500 shown in FIG. 16E includes propellers 6501, a camera 6502, a battery 6503, and the like and has a function of flying autonomously.

For example, image data taken by the camera 6502 is stored in an electronic component 6504. The electronic component 6504 can analyze the image data to sense whether there are obstacles when the flying object moves.

Moreover, the electronic component 6504 can estimate the remaining battery level from change in the power storage capacity of the battery 6503. The flying object 6500 includes a communication device therein. When the semiconductor device of one embodiment of the present invention is used in the flying object 6500, the power consumption by the flying object 6500 can be reduced.

Communication devices provided in the above electronic devices can have various communication methods such as a near field communication method (e.g., Wi-Fi (registered trademark), Bluetooth (registered trademark)), a communication method satisfying the third generation mobile communication system (e.g., LTE), a communication method satisfying the fourth generation mobile communication system (4G), and a communication method satisfying the fifth generation mobile communication system (5G).

Display portions on the above electronic devices can use light-emitting elements and the like. Examples of light-emitting elements are self-luminous light-emitting elements such as an LED (Light Emitting Diode), an OLED (Organic LED), a QLED (Quantum-dot LED), and a semiconductor laser. As display elements used in the display portions, a liquid crystal element such as a transmissive liquid crystal element, a reflective liquid crystal element, or a transflective liquid crystal element can also be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Organic electroluminescent elements are preferably used in the display portions. By using organic electroluminescent elements, the display portions can be provided on flexible substrates. By using flexible display portions in electronic devices, light electronic devices with display portions which are not easily damaged can be provided.

In addition, the resolution of a screen may be, for example, full high definition (the number of pixels: 1920×1080; also referred to as "2K", for example), ultra high definition (the number of pixels: 3840×2160; also referred to as "4K", for example), and super high definition (the number of pixels: 7680×4320; also referred to as "8K", for example).

This embodiment can be implemented in combination with any of the structures described in the other embodiments and the like, as appropriate.

REFERENCE NUMERALS

100: semiconductor device, 110: transmitter-receiver unit, 111: transmitter unit, 112: bias-outputting unit, 113: receiver unit, 114: variable amplifier unit, 115: power amplifier unit, 116: power detector unit, 120: converter unit, 121: microphone, 122: speaker, 123: modulator, 124: demodulator, 130: controller unit, 131: arithmetic unit, 132: memory unit, 133: DAC, 140: duplexer, 150: antenna, 200: memory portion, 201: terminal, 202: terminal, 203: terminal, 204: terminal

The invention claimed is:

1. A semiconductor device comprising:
a transmitter unit, a receiver unit, a bias-outputting unit, and a controller unit,
wherein the transmitter unit is configured to change an output power,
wherein the receiver unit is configured to supply a first signal included in a received signal to the controller unit,
wherein the bias-outputting unit comprises a plurality of memory units,
wherein the controller unit is configured to select a first memory unit out of the plurality of memory units according to the first signal,
wherein the bias-outputting unit is configured to output a second signal according to first data retained in the first memory unit,
wherein the transmitter unit is configured to determine the output power according to the second signal,
wherein the memory unit comprises a first transistor and a capacitor, and
wherein a semiconductor layer of the first transistor comprises an oxide semiconductor.

2. The semiconductor device according to claim 1,
wherein the semiconductor layer comprises one or both of In and Zn.

3. The semiconductor device according to claim 1,
wherein the memory unit is configured to retain the first data when power supply is stopped.

4. The semiconductor device according to claim 1,
wherein the controller unit is configured to write data to each of the plurality of memory units.

5. An electronic device comprising:
the semiconductor device according to claim 1; and
an antenna, a microphone, and a speaker.

* * * * *